US009105370B2

(12) United States Patent
Kim et al.

(10) Patent No.: US 9,105,370 B2
(45) Date of Patent: Aug. 11, 2015

(54) CONDUCTIVE PASTE, AND ELECTRONIC DEVICE AND SOLAR CELL INCLUDING AN ELECTRODE FORMED USING THE SAME

(75) Inventors: Se Yun Kim, Seoul (KR); Eun Sung Lee, Seoul (KR); Sang Soo Jee, Hwaseong-si (KR); Ki Hong Kim, Asan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 320 days.

(21) Appl. No.: 13/348,169

(22) Filed: Jan. 11, 2012

(65) Prior Publication Data
US 2012/0174976 A1 Jul. 12, 2012

(30) Foreign Application Priority Data

Jan. 12, 2011 (KR) .................. 10-2011-0003205
Jul. 28, 2011 (KR) .................. 10-2011-0075364

(51) Int. Cl.
*H01B 1/02* (2006.01)
*H01B 1/22* (2006.01)
*H01L 31/0224* (2006.01)

(52) U.S. Cl.
CPC ........ *H01B 1/026* (2013.01); *H01L 31/022425* (2013.01); *Y02E 10/50* (2013.01)

(58) Field of Classification Search
USPC ............................ 252/512–514; 136/244, 256
See application file for complete search history.

(56) References Cited

U.S. PATENT DOCUMENTS

| 4,434,084 | A | 2/1984 | Hicks et al. |
| 4,962,066 | A | 10/1990 | Starz |
| 5,170,930 | A | 12/1992 | Dolbear et al. |
| 6,027,575 | A | 2/2000 | Paruchuri et al. |
| 6,420,067 | B1 | 7/2002 | Yoshioka |
| 7,056,394 | B2 | 6/2006 | Inoue et al. |
| 7,147,727 | B2 | 12/2006 | Kim et al. |
| 7,183,018 | B2 | 2/2007 | Kawakami et al. |
| 7,399,370 | B2 | 7/2008 | Inoue et al. |
| 7,947,134 | B2 | 5/2011 | Lohwongwatana et al. |
| 2002/0036034 | A1 | 3/2002 | Xing et al. |
| 2004/0245507 | A1 | 12/2004 | Nagai et al. |

(Continued)

FOREIGN PATENT DOCUMENTS

| CN | 101055776 A | 10/2007 |
| CN | 101186128 A | 5/2008 |

(Continued)

OTHER PUBLICATIONS http://environmentalchemistry.com/yogi/periodic/atomicradius.html.*

(Continued)

*Primary Examiner* — Khanh Tuan Nguyen
(74) *Attorney, Agent, or Firm* — Harness, Dickey & Pierce, P.L.C.

(57) ABSTRACT

A conductive paste includes a conductive powder, a metallic glass, and an organic vehicle. The metallic glass may be an alloy including a first element with an atomic radius that satisfies the following equation: $(r_1-r_n)/(r_1+r_n/2)\times 100 \geq 9\%$ In the equation, $r_1$ may be an atom radius of the first element, $r_n$ may be an atom radius of other elements included in the metallic glass, and n may be an integer ranging from 2 to 10.

20 Claims, 9 Drawing Sheets

(56) References Cited

U.S. PATENT DOCUMENTS

| | | |
|---|---|---|
| 2005/0019203 A1 | 1/2005 | Saitoh et al. |
| 2005/0211340 A1 | 9/2005 | Kim et al. |
| 2005/0228097 A1 | 10/2005 | Zhong |
| 2006/0102228 A1 | 5/2006 | Sridharan et al. |
| 2007/0031730 A1 | 2/2007 | Kawakami et al. |
| 2007/0034305 A1 | 2/2007 | Suh |
| 2007/0072969 A1 | 3/2007 | Lee et al. |
| 2007/0102676 A1 | 5/2007 | Lee et al. |
| 2007/0137737 A1 | 6/2007 | Guo et al. |
| 2007/0157852 A1 | 7/2007 | Lee et al. |
| 2008/0196794 A1 | 8/2008 | Blandin et al. |
| 2009/0056798 A1 | 3/2009 | Merchant et al. |
| 2009/0101190 A1 | 4/2009 | Salami et al. |
| 2009/0211626 A1 | 8/2009 | Akimoto |
| 2009/0250106 A1 | 10/2009 | Hayashi et al. |
| 2009/0298283 A1 | 12/2009 | Akimoto et al. |
| 2010/0037990 A1 | 2/2010 | Suh |
| 2010/0096014 A1 | 4/2010 | Iida et al. |
| 2010/0098840 A1 | 4/2010 | Du et al. |
| 2010/0101637 A1 | 4/2010 | Yamasaki et al. |
| 2011/0114170 A1 | 5/2011 | Lee et al. |
| 2011/0162687 A1 | 7/2011 | Moon et al. |
| 2012/0031481 A1 | 2/2012 | Jee et al. |
| 2012/0103409 A1 | 5/2012 | Kim et al. |

FOREIGN PATENT DOCUMENTS

| | | |
|---|---|---|
| CN | 101359564 A | 2/2009 |
| EP | 1039568 | 9/1999 |
| EP | 2325848 | 5/2011 |
| EP | 2416327 A1 | 2/2012 |
| EP | 2448003 A2 | 5/2012 |
| EP | 2450908 | 5/2012 |
| JP | 62-062870 | 3/1987 |
| JP | 10-040738 | 2/1998 |
| JP | 10144139 | 5/1998 |
| JP | 2000-311681 A | 11/2000 |
| JP | 2002-080902 A | 3/2002 |
| JP | 2002-298651 | 10/2002 |
| JP | 2003-013103 A | 1/2003 |
| JP | 2003003246 | 1/2003 |
| JP | 2004091868 | 3/2004 |
| JP | 2005-050983 | 2/2005 |
| JP | 2008-010527 | 1/2008 |
| JP | 2010-018878 | 1/2009 |
| JP | 2009-099371 | 5/2009 |
| JP | 2009-138266 | 6/2009 |
| JP | 2009-197323 | 9/2009 |
| JP | 2010133021 | 6/2010 |
| JP | 2010199196 A | 9/2010 |
| KR | 2002-0037772 | 5/2002 |
| KR | 1020050087249 A | 8/2005 |
| KR | 1020050096258 | 10/2005 |
| KR | 10-0677805 | 1/2007 |
| KR | 1020070106887 | 11/2007 |
| WO | WO 01/31085 | 5/2001 |
| WO | WO-2005/096320 A2 | 10/2005 |
| WO | WO2005096320 | 10/2005 |
| WO | WO2009108675 | 9/2009 |
| WO | WO2010/033281 | 3/2010 |
| WO | WO 2010033281 | 3/2010 |

OTHER PUBLICATIONS

US Office Action dated Dec. 10, 2012 corresponding to U.S. Appl. No. 13/016,403.

Partial European Search Report for 10190652.7-2102 dated Mar. 23, 2011.

European Search Report dated Dec. 20, 2011.

Lin et al., "Effect of Ni on glass-forming ability og Cu—Ti-based amorphous alloys", 2006, Transactions of Nonferrous Metals Society of China, 16, pp. 604-606.

Arai et al., "Nanocrystal Formation of Metals in Thermally Grown Thin Silicon Dioxide Layer by Ion Implantation and Thermal Diffusion of Implanted Atoms in Heat Treatment", J. Phys. Conf., Ser. 61, 2007; 41-45.

Powell et al., Development of metallic glass loaded polymer paste, J. of Materials Processing Tech., 2001, pp. 318-323.

Schubert, G. et al., "Silver thick film contact formation on lowly doped phosphorous emitters", 2005, Proceedings 20th EPVSEC, Barcelona, pp. 934-937.

Kim S J et al: "Silver/metallic glass paste for shallow emitter Si-solar cell", 26th European Photovoltaic Solar Energy Conference and Exhibition, Sep. 5-9, 2011, pp. 492-494, XP009160654.

Lee S-W et al: "Design of a bulk amorphous alloy containing Cu—Zr with simultaneous improvement in glass-forming ability and plasticity", Journal of Materials Research, vol. 22, No. 02, Feb. 2007, pp. 486-492, XP55031306.

Kim Y C et al: "Enhanced glass of forming ability and mechanical properties of new Cu-based bulk metallic glasses", Materials Science and Engineering A: Structual Materials: Properties, Microstructure & Processing, Lausanne, CH, vol. 437, No. 2, Nov. 15, 2006, pp. 248-253, XP027953056.

Neuhaus D-H et al: "Industrial Silicon Wafer Solar Cells", Advance in Optoelectronics, vol. 2007, XP 55031298.

Bashev V F et al: "Crystallization of Al—Ni alloys during rapid cooling", Russian Metallurgy, Allerton Press, Inc, No. 6, 1989, pp. 51-54, XP009160582.

Ivanov E et al: "Synthesis of nickel aluminides by mechanical alloying", Materials Letters, North Holland Publishing Company, Amsterdam, NL, vol. 7, No. 1-2, Aug. 1988, pp. 51-54, XP024149792.

Lim S S et al: "Assessment of the Al—Ag Binary Phase Diagram", CALPHAD, vol. 19, No. 2, 1995, pp. 131-141, XP55017954.

Wang Q et al: "Cluster line criterion and Cu—Zr—Al bulk metallic glass formation", Materials Science and Engineering A: Structural Materials: Properties, Microsturcture & Processing, Lausanne, CH, vol. 449-451, Mar. 19, 2007, pp. 18-23, XP005914563.

Metallurgy Division of the Materials Science and Engineering Laboratory of NIST: "Ag—Cu—Sn System", Aug. 5, 2010, XP55031251, Retrieved from the Internet: http://web.archive.org/web/20100805072225/http://www.metallurgy.nist.gov/phase/solder/agcusn.html.

Oh C-S et al: "A thermodynamic study on the Ag—Sb—Sn system", Journal of alloys and compounds, elsevier sequoia, Iausanne, CH, vol. 238, May 1, 1996, pp. 155-166, XP004080478.

Baren M R: "Ag—In (Silver—Indium)" In: White C E T, Okamoto H (Editors): "Phase Diagrams of Indium Alloys and their engineering applications", 1992; ASM International, Materials Park, XP008098250.

Gorshkov N N et al: "Explosive compaction of amorphous Cu—Sn powder prepared by the method of mechanical alloying", Combustion, Explosion, and shock waves, vol. 25, No.. 2, 1989, pp. 244-247.

Salkar R A et al: "The sonochemical preparation of amorphous silver nanoparticles", Journal of materials chemistry, vol. 9, No. 6, 1999, pp. 1333-1335.

"Amorphous metal", Wikipedia, Oct. 21, 2010, XP55017848, Retrieved from the internet: URL: http://en.wikipedia.org/w/index.php?title=amorphous_metal&oldid=392080524.

"Electrical resitivity of pure metals" in: "CRC Handbook of chemistry and physics, 77th edition", 1996, CRC Press, Boca raton, New york, London, Tokyo, XP002668350.

US Office Action dated May 15, 2013 corresponding to U.S. Appl. No. 13/016,403.

US Office Action dated Jun. 5, 2013 corresponding to U.S. Appl. No. 12/943,732.

NIST, Properties of Lead-Free Solders, Release 4.0, Feb. 2002.

Notice of Allowance dated Jun. 12, 2013 corresponding to U.S. Appl. No. 13/208,705.

Mohamed M. Hilali et al., "Effect of Ag Particle Size in Thick-Film Ag Paste on the Electrical and Physical Properties of Screen Printed Contacts and Silicon Solar Cells," J. Electromech.Soc. vol. 153, No. 1, pp. A5-A11 (2006).

US Office Action dated Oct. 8, 2013 corresponding to U.S. Appl. No. 13/281,835.

US Office Action dated Aug. 23, 2013 corresponding to U.S. Appl. No. 13/016,403.

(56) References Cited

OTHER PUBLICATIONS

US Office Action dated Oct. 23, 2013 corresponding to U.S. Appl. No. 12/943,732.
Don-Ik Lee, et al., "Effect of TRITON™ X-based Dispersants Bearing a Carboyxlic Terminal Group on Rheological Properties of BAM/Ethyl Cellulose/Terpineol Paste", Journal of Applied Polymer Science, vol. 105, 2012-2019 (2007).
Don-Ik Lee, et al., "Plasma Display Material Prepared from a New Blue Phosphor Dispersion" Journal of Applied Polymer Science, vol. 108, 2571-2577 (2008).
Don-Ik Lee, et al., "Synthesis and Characterization of TRITON™ X-Based Surfactants with Carboxylic or Amino Groups in the Oxyethylene Chain End", Journal of Applied Polymer Science, vol. 104, 162-170 (2007).
M. Chen, "A brief overview of bulk metallic glasses", NPG Asia Materials, vol. 3, Step. 2011, pp. 82-90.
Reda, I.M., et al., "Amorphous Cu—Ag Films With High Stability," International Centre for Theoretical Physics, 1982.
Se Yun Kim et al. "Replacement of oxide glass with metallic glass for Ag screen printing metallization on Si emitter," *App. Phys. Lett.*, Am. Inst. Phys., vol. 98, No. 222112 Jun. 3, 02011).
ASM Handbook. vol. 3 Alloy Phase Diagrams, *The Materials Information Soc.*, Hugh Baker, Ed., ASM International (1992).
Extended European Search Report dated Feb. 5, 2013, issued in European Application No. 11177515.1.
Wang, et al., "Atomic structure and glass forming ability of Cu46Zr46A18 bulk metallic glass," J. Appl. Phys., vol. 104, pp. 093519-1-093519-5 (2008).
Yi, S. et al. "Ni-based bulk amorphous alloys in the Ni—Ti—Zr—(Si,Sn) system"; Journal of Materials Research, vol. 15, No. 11, p. 2425-2430; Nov. 2000.
Wang, W. "Roles of minor additions in formation and properties of bulk metallic glasses" Progress in Materials Science, vol. 52 p. 540-596; 2007.
Japanese Office Action dated Apr. 1, 2014 for corresponding application No. JP 2010-252993.
US Office Action dated Feb. 5, 2014 corresponding to U.S. Appl. No. 13/307,932.
Office Action dated Apr. 25, 2014 for corresponding U.S. Appl. No. 13/206,880.
Office Action dated May 1, 2014 for corresponding U.S. Appl. No. 12/943,732.
Office Action dated May 2, 2014 for corresponding U.S. Appl. No. 13/281,835.
Hilali et al., "Effect of glass frit chemistry on the physical and electrical properties of thick-film Ag contacts for silicon solar cells", Journal of Electronic Materials. vol. 35, Issue 11, pp. 2041-2047, 2008.
Rane et al., "Effect of inorganic binders on the properties of silver thick films", Journal of Materials Science: Materials in Electronics, vol. 15, Issue 2, pp. 103-106; 2004.
Busch et al., "Viscosity of the supercooled liquid and relaxation at the glass transition of the bulk metallic glass forming alloy", Acta Materialia, vol. 46, Issue 13, pp. 4725-4732; 1998.
Kuo et al., "Measurement of low-temperature transport properties of Cu-based Cu—Zr—Ti bulk metallic glass", Physical Review B, vol. 74, pp. 014208-1 to 014208-7; 2006.
Zhang et al. "Thermal and Mechanical Properties of Ti—Ni—Cu—Sn Amorphous Alloys with a Wide Supercooled Liquid Region before Crystallization"; Materials Transactions, vol. 39, p. 1001-1006; 1998.
Chinese Office Action dated Jun. 5, 2014 for corresponding Chinese application No. 201010544709, and English-language translation.
Final Office Action for corresponding U.S. Appl. No. 13/206,880 dated Oct. 14, 2014.

\* cited by examiner

US 9,105,370 B2

CONDUCTIVE PASTE, AND ELECTRONIC DEVICE AND SOLAR CELL INCLUDING AN ELECTRODE FORMED USING THE SAME

PRIORITY STATEMENT

This application claims priority to and the benefit of Korean Patent Application No. 10-2011-0003205 filed in the Korean Intellectual Property Office on Jan. 12, 2011 and Korean Patent Application No. 10-2011-0075364 filed in the Korean Intellectual Property Office on Jul. 28, 2011, the entire contents of each of which are incorporated herein by reference.

BACKGROUND

1. Field

Example embodiments provide a conductive paste, and an electronic device and a solar cell including an electrode using the conductive paste.

2. Description of the Related Art

A solar cell may be a photoelectric conversion device that transforms solar energy into electrical energy. Solar cells have attracted attention as a potentially infinite and pollution-free next generation energy source.

A solar cell may include p-type and n-type semiconductors. When an electron-hole pair ("EHP") is produced by light absorbed in a photoactive layer of the semiconductors, the solar cell may produce electrical energy by transferring electrons and holes to the n-type and p-type semiconductors, respectively, and then collecting the electrons and holes in electrodes of the solar cell.

A solar cell should desirably have the highest possible efficiency for producing electrical energy from solar energy. In order to improve this efficiency, the solar cell desirably absorbs light with minor loss so that the solar cell may produce as many electron-hole pairs as possible, and collect the produced charges.

An electrode may be conventionally fabricated by a deposition method, which may include a relatively complicated, long and expensive process.

SUMMARY

Example embodiments provide a conductive paste that decreases loss of charges and improves efficiency of a solar cell. Example embodiments also provide an electronic device including an electrode formed by using the conductive paste. Example embodiments also provide a solar cell including an electrode formed by using the conductive paste.

According to example embodiments, a conductive paste may include a conductive powder, a metallic glass, and an organic vehicle, wherein the metallic glass may be an alloy including a first element with an atomic radius satisfying the following equation.

$$\frac{|r_1 - r_n|}{\left(\frac{r_1 + r_n}{2}\right)} \times 100 \geq 9(\%) \quad \text{[Equation]}$$

In the Equation, $r_1$ may be an atom radius of the first element, $r_n$ may be an atom radius of other elements included in the metallic glass, and n may be an integer ranging from 2 to 10.

The metallic glass may include a supercooled liquid region. A temperature of the supercooled liquid region ranges from about 5° C. to about 200° C. The metallic glass may have a heat of mixing value of less than 0 kJ/mole.

The metallic glass may further include at least one of a second element having a resistivity less than about 100 µΩcm, a third element configured to form a solid solution with the conductive powder, and a fourth element having an absolute value of Gibbs free energy of oxide formation that is about 100 kJ/mol or more. The resistivity of the second element may be less than about 15 µΩcm. The third element may have a heat of mixing value of less than 0 kJ/mole with the conductive powder. The fourth element may have a higher absolute value of Gibbs free energy of oxide formation than the first element, the second element, and the third element.

The second element, the third element, and the fourth element may be respectively selected from copper (Cu), zirconium (Zr), and tin (Sn), and the first element may be selected from phosphorus (P), antimony (Sb), beryllium (Be), boron (B), thorium (Th), erbium (Er), terbium (Tb), promethium (Pm), dysprosium (Dy), yttrium (Y), samarium (Sm), gadolinium (Gd), holmium (Ho), neodymium (Nd), cerium (Ce), lanthanum (La), calcium (Ca), ytterbium (Yb), europium (Eu), strontium (Sr), barium (Ba), potassium (K), rubidium (Rb), cesium (Cs), and a combination thereof.

The conductive powder, the metallic glass and the organic vehicle may be included at about 30 wt % to about 99 wt %, about 0.1 wt % to about 20 wt %, and about 0.9 wt % to about 69.9 wt % based on the total amount of the conductive paste, respectively.

According to example embodiments, an electronic device may include an electrode formed using the conductive paste.

According to example embodiments, a solar cell may include an electrode electrically connected with a semiconductor layer, the electrode formed using the conductive paste.

The metallic glass may have a heat of mixing value of less than 0 kJ/mole. The metallic glass may further include at least one of a second element having a resistivity less than about 100 µΩcm, a third element configured to form a solid solution with the conductive powder, and a fourth element having an absolute value of Gibbs free energy of oxide formation that is about 100 kJ/mol or more. The resistivity of the second element may be less than about 15 µΩcm. The third element may have a heat of mixing value of less than 0 kJ/mole with the conductive powder. The fourth element may have a higher absolute value of Gibbs free energy of oxide formation than the first element, the second element, and the third element.

The electrode may include a buffer layer on a first region of the semiconductor layer, and an electrode portion on a second region of the semiconductor layer different from the first region. The buffer layer may include a crystallized metallic glass. At least one of the semiconductor layer, the buffer layer, and the interface of the semiconductor layer and the buffer layer may include a crystallized conductive powder.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

FIG. 1 is a schematic view showing a relative size of metal atoms included in the conductive paste according to example embodiments.

FIG. 3 to FIG. 5 are schematic views showing an example of the conductive powder and the metallic glass that are thermally deformed to contact the semiconductor substrate when the conductive paste according to example embodiments may be applied on the semiconductor substrate.

FIG. 7 is a cross-sectional view showing a solar cell according to example embodiments.

FIG. 8 is a cross-sectional view showing a solar cell according to example embodiments.

Figure 1:
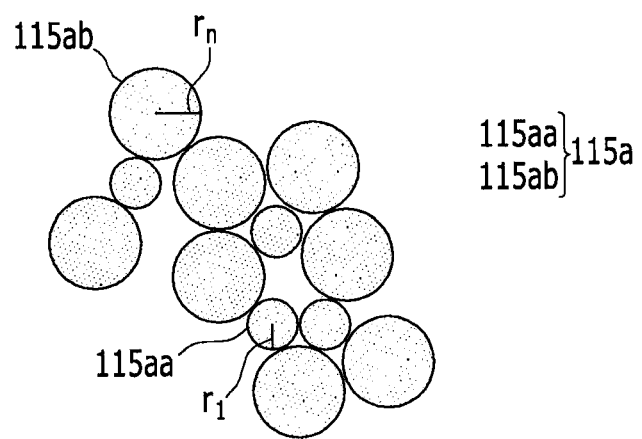

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the term 'element' refers to a metal and a semimetal.

A conductive paste according to example embodiments may include a conductive powder, a metallic glass, and an organic vehicle. The conductive powder may include an aluminum (Al)-containing metal, e.g., aluminum or an aluminum alloy, a silver (Ag)-containing metal, e.g., silver or a silver alloy, a copper (Cu)-containing metal, e.g., copper (Cu) or a copper alloy, a nickel (Ni)-containing metal, e.g., nickel (Ni) or a nickel alloy, or a combination thereof. However, the conductive powder may not be limited thereto and may include other metals and an additive other than the metals.

The conductive powder may have a size (e.g., average largest particle size) ranging from about 1 nm to about 50 micrometers (μm). The metallic glass may include an amorphous alloy having a disordered atomic structure including two or more elements. The metallic glass may be an amorphous metal. The metallic glass may have relatively low resistance unlike a conventional glass, e.g., a silicate, and thus may be conductive.

The metallic glass may be an alloy including two or more elements as described above. One component of the metallic glass alloy may be a first element that is capable of expanding a supercooled liquid region of the metallic glass.

Herein, the supercooled liquid region of a metallic glass may be a temperature region between a glass transition temperature (Tg) and a crystallization temperature (Tc) of the metallic glass. In the supercooled liquid region, the metallic glass may have relatively low viscosity and demonstrate a liquid-like behavior.

In the supercooled liquid region, e.g., a temperature region between glass transition temperature (Tg) and crystalline temperature (Tc), the metallic glass shows a liquid-like behavior and may wet a lower layer. Herein, when the supercooled liquid region is extended, the metallic glass may reinforce the wetting.

For example, when a conductive paste including the metallic glass is applied to a semiconductor substrate to fabricate an electrode for a solar cell, a larger supercooled liquid region of the softened metallic glass on the semiconductor substrate may demonstrate improved wetting properties. The improved wetting properties may cause the conductive powder diffused inside the softened metallic glass to permeate into a larger area of the semiconductor substrate. Accordingly, the electrode contacts more of the semiconductor substrate, not only improving adherence therebetween but also forming a larger path through which charges produced from the semiconductor substrate by solar light may transfer to the electrode. As a result, the electrode may improve efficiency of a solar cell.

The first element may reduce the glass transition temperature (Tg) of the metallic glass but increase the crystallization temperature (Tc) of the metallic glass, thereby extending the supercooled liquid region that demonstrates a liquid-like behavior. For example, the first element may be included in the metallic glass, may hamper mutual interaction with other elements and may suppress their nucleus formation, thereby delaying crystallization of the metallic glass.

The first element capable of expanding a supercooled liquid region may have an atom radius satisfying the following equation.

$$\frac{|r_1 - r_n|}{\left(\frac{r_1 + r_n}{2}\right)} \times 100 \geq 9(\%)$$ [Equation]

In the equation, $r_1$ may be an atom radius of the first element, $r_n$ may be an atom radius of other elements except the first element included in the metallic glass, and n may be an integer ranging from 2 to 10.

The metallic glass decreases the viscosity in the supercooled liquid region, demonstrates liquid-like behavior and relatively freely transfers atoms as described above. By making a difference between the atom radius of the first element and the atom radius of other elements about 9% or more according to the equation, elements having a small atom radius may be densely aligned into pores among elements having a large atom radius, thereby interfering with the transfer of elements. Because this may be satisfied by the difference between the atom sizes of the different kinds of elements according to the equation, the first element may have a larger or smaller atom radius than other elements.

In example embodiments, the first element may provide a dense structure compared to the case including a similar size of elements, so the first element may interfere with the transfer of elements in the supercooled liquid region. Accordingly, the first element may delay crystallization of the metallic glass by decreasing the mutual interaction between elements. This may be described with reference to FIG. 1.

FIG. 1 is a schematic diagram showing the relative size of elements included in the conductive paste according to example embodiments. Referring to FIG. 1, a metallic glass 115a may include a first element 115aa and another element 115ab different from the first element 115aa and having a different particle size. The first element 115aa may be a component that extends the supercooled liquid region, and the other element 115ab may include at least one of a following second element, a third element, and a fourth element except the first element 115aa.

The first element 115aa may have an atom radius of $r_1$, and the other element 115ab may have an atom radius of $r_n$. According to the equation above, the value of a difference between the atom radius $r_1$ of the first element 115aa and the atom radius $r_n$ of the other element 115ab may be divided by the average of the atom radius of the first element 115aa and the other element 115ab. The determined value may be about 9% or more, meaning that the size difference of the first element 115aa and the other element 115ab is relatively high.

Therefore, because the first element may have a relatively large difference in particle size from the other element included in the metallic glass, the first element may provide a metallic glass with a more condensed structure. The first element also may interfere with the transfer of elements, thereby increasing the crystallization temperature (Tc) of the metallic glass.

Although the first element 115aa may have a smaller atom radius than other elements 115ab in FIG. 1, example embodiments may not be limited thereto, and the other elements 115ab may have a smaller atom radius than the first element 115aa as long as the equation may be satisfied.

For example, if the metallic glass includes copper (Cu), zirconium (Zr), and tin (Sn) as the other elements, the equation may be calculated by using the radius of each element.

Table 1 shows the first element satisfying the equation in the case that the metallic glass includes copper (Cu), zirconium (Zr), and tin (Sn).

TABLE 1

| First element (X) | Cu—X (%) | Zr—X (%) | Sn—X (%) |
|---|---|---|---|
| P | 31.674 | 52.9644 | 41.026 |
| Sb | 34.839 | 12.8655 | 25.387 |
| Be | 12.448 | 34.4322 | 22.047 |
| B | 42.654 | 63.3745 | 51.786 |
| Th | 33.766 | 11.7647 | 24.299 |
| Er | 31.579 | 9.52381 | 22.082 |
| Tb | 32.68 | 10.6509 | 23.197 |
| Pm | 34.304 | 12.3167 | 24.845 |
| Dy | 32.131 | 10.089 | 22.642 |
| Y | 34.304 | 12.3167 | 24.845 |
| Sm | 33.766 | 11.7647 | 24.299 |
| Gd | 33.766 | 11.7647 | 24.299 |
| Ho | 32.131 | 10.089 | 22.642 |
| Nd | 34.839 | 12.8655 | 25.387 |
| Ce | 35.37 | 13.4111 | 25.926 |
| La | 37.975 | 16.092 | 28.571 |
| Ca | 42.462 | 20.7283 | 33.136 |
| Yb | 40.994 | 19.209 | 31.642 |
| Eu | 36.422 | 14.4928 | 26.994 |
| Sr | 50.729 | 29.3333 | 41.573 |
| Ba | 51.594 | 30.2387 | 42.458 |
| K | 55.775 | 34.6253 | 46.739 |
| Rb | 63.83 | 43.1373 | 55.013 |
| Cs | 69.72 | 49.4118 | 61.084 |

The metallic glass may have a supercooled liquid region, and the supercooled liquid region of the metallic glass may have a temperature that ranges from about 5° C. to about 200° C.

On the other hand, the metallic glass including the first element may have a smaller heat of mixing value than that of an alloy including no first element. Specifically, the metallic glass including the first element may have a heat of mixing value of less than 0 kJ/mole. When the metallic glass includes the first element, the metallic glass may have a more thermodynamically stable structure.

The metallic glass may further include at least one of a second element having relatively low resistivity, a third element forming a solid solution with the conductive powder, and a fourth element having a relatively high oxidizing property, wherein the second element may have resistivity of less than about 100 μΩcm, and the fourth element may have an absolute value of Gibbs free energy of oxide formation more than about 100 kJ/mol.

The second element may have lower resistivity than the first element, the third element, and the fourth element and may determine the conductivity of the metallic glass. For example, the second element may have a resistivity of less than about 15 μΩcm.

The second element may include at least one of silver (Ag), copper (Cu), gold (Au), aluminum (Al), calcium (Ca), beryllium (Be), magnesium (Mg), sodium (Na), molybdenum (Mo), tungsten (W), zinc (Zn), nickel (Ni), potassium (K), lithium (Li), iron (Fe), palladium (Pd), platinum (Pt), rubidium (Rb), chromium (Cr), and strontium (Sr).

The third element may be a component that is capable of forming a solid solution with the conductive powder.

When the metallic glass is heated higher than the glass transition temperature ($T_g$), the metallic glass may be relatively soft and demonstrate a liquid-like behavior. Herein, because the metallic glass includes a third element capable of forming a solid solution with the conductive powder, the conductive powder may be diffused into the softened metallic glass.

For example, when the conductive paste including a metallic glass is applied on a semiconductor substrate to form an electrode for a solar cell, the metallic glass may become relatively soft due to the heat treatment. In addition, during the heat treatment, the conductive powder may form a solid solution with a third element included in the metallic glass and may be diffused into the softened metallic glass.

Finally, the conductive powder may be diffused into the semiconductor substrate through the softened metallic glass. Accordingly, recrystallized particles of the conductive powder may be produced at the surface of the semiconductor substrate in a relatively large amount. Thereby, the conductive powder may enhance the efficiency of the solar cell because the conductive powder may effectively transfer the charge produced by the solar light into the electrode by the recrystallized particles of the conductive powder produced at the surface of the semiconductor substrate.

The third element that is capable of forming a solid solution with the conductive powder may be selected from elements having a heat of mixing (Hm) value of less than 0 kJ/mol compared with the conductive powder.

For example, when the conductive powder includes silver (Ag), the third element may include, for example, at least one of lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), ytterbium (Yb), strontium (Sr), europium (Eu), zirconium (Zr), lithium (Li), hafnium (Hf), magnesium (Mg), phosphorus (P), arsenic (As), palladium (Pd), gold (Au), plutonium (Pu), gallium (Ga), germanium (Ge), aluminum (Al), zinc (Zn), antimony (Sb), silicon (Si), tin (Sn), titanium (Ti), cadmium (Cd), indium (In), platinum (Pt), and mercury (Hg).

The fourth element may have a higher oxidizing property than other elements of the metallic glass. Therefore, the fourth element may be oxidized faster than other elements, so as to prevent or inhibit the other elements from being oxidized.

The conductive paste including the metallic glass may be generally processed while being exposed to air, in particular, the oxygen in the air. When the first element is oxidized, the supercooled liquid region may be reduced to deteriorate the wettability. When the second element is oxidized, the conductivity of the conductive paste may be deteriorated. When the third element is oxidized, the solid solubility of the conductive powder may be reduced.

Accordingly, because metallic glass includes the fourth element having a higher oxidizing property than the first element, the second element, and the third element, the fourth element may be oxidized faster to provide a stable oxide layer on the surface of the metallic glass. Therefore, the fourth element may prevent or inhibit the oxidation of other elements of the metallic glass. Accordingly, the fourth element may prevent or inhibit the performance deterioration of the conductive paste due to the oxidation of other elements of the metallic glass.

The fourth element may be selected from elements having a higher absolute value of Gibbs free energy of oxide formation)($\Delta_f G^0$) than the first element, the second element, and the third element. As the absolute value of Gibbs free energy of oxide formation is higher, oxidization becomes easier.

On the other hand, the first element, the second element, and the third element may have a larger Gibbs free energy difference of oxide formation from the fourth element. The first element may have a lower absolute value of Gibbs free energy of oxide formation by about 300 kJ/mol or more than that of the fourth element.

The Gibbs free energy difference of oxide formation between two elements indicates a similarity of oxidizing property in the air. If the Gibbs free energy difference of oxide formation between the first element and the fourth element is less than about 300 kJ/mole, the first element may be oxidized with the fourth element. In example embodiments, two different structured oxides may be generated, and oxygen in the air may easily flow in through the phase boundary between the oxides so as to deteriorate the oxidation resistance of metallic glass.

As described above, the conductive paste according to example embodiments may include a metallic glass including a first element capable of extending a supercooled liquid region and at least one of a second element having a relatively low resistance, a third element forming a solid solution with the conductive powder, and a fourth element having a higher oxidizing property than the first element, the second element, and the third element.

The metallic glass may form an alloy of at least one of the second, third and fourth elements with the first element. Accordingly, the first to fourth elements may form a metallic glass with various compositions. For example, when the first element is 'A', 'A1', or 'A2', the second element is 'B', 'B1', or 'B2', the third element is 'C', 'C1', or 'C2', and the fourth element is 'D', 'D1', or 'D2', the combination may include alloys of various combinations of two components or more, e.g., two components to ten components, or two components to six components, e.g., A-B, A-C, A-D, A-B-C, A-B-D, A-C-D, A-B-C-D, A-A1-B-B1, A-A1-B-B1-C, A-A1-B-B1-C-C1, A-A1-B-B1-C-D, etc.

The organic vehicle may include an organic compound mixed with the conductive powder and the metallic glass to impart viscosity to the organic vehicle. A solvent that can dissolve the foregoing components may also be included.

The organic compound may include, for example, at least one selected from a (meth)acrylate-based resin, a cellulose resin, e.g., ethyl cellulose, a phenol resin, an alcohol resin, tetrafluoroethylene (TEFLON), and a combination thereof, and may further include an additive, e.g., a surfactant, a thickener, or a stabilizer.

The solvent may be any solvent that is capable of dissolving the above compounds, and may include, for example, at least one selected from terpineol, butylcarbitol, butylcarbitol acetate, pentanediol, dipentyne, limonene, ethyleneglycol alkylether, diethyleneglycol alkylether, ethyleneglycol alkylether acetate diethyleneglycol alkylether acetate, diethyleneglycol dialkylether acetate, triethyleneglycol alkylether acetate, triethylene glycol alkylether, propyleneglycol alkylether, propyleneglycol phenylether, dipropyleneglycol alkylether, tripropyleneglycol alkylether, propyleneglycol alkylether acetate, dipropyleneglycol alkylether acetate, tripropyleneglycol alkyl ether acetate, dimethylphthalic acid, diethylphthalic acid, dibutylphthalic acid, and desalted water.

The conductive powder, the metallic glass and the organic vehicle may be included in respective amounts of about 30 wt % to about 99 wt %, about 0.1 wt % to about 20 wt %, and about 0.9 wt % to about 69.9 wt % based on the total weight of the conductive paste. The conductive paste may be disposed by screen-printing to provide an electrode for an electronic device.

Figure 3:
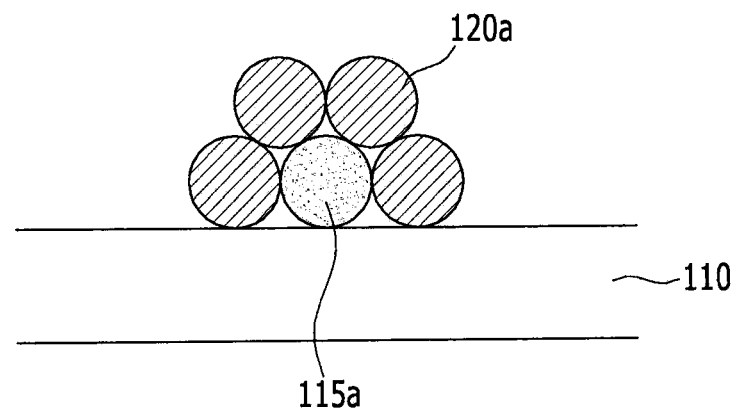
Figure 4:
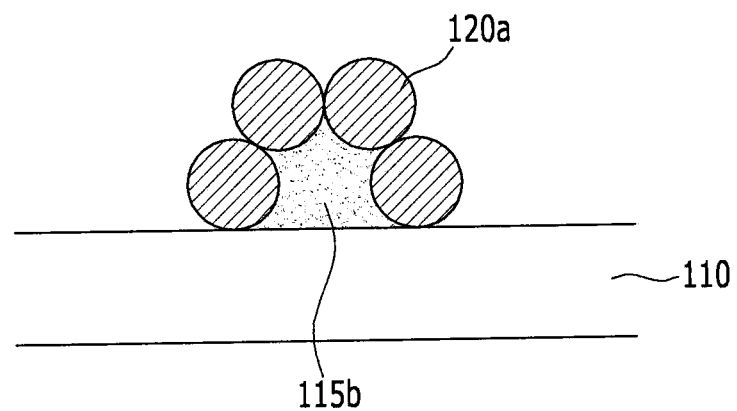
Figure 5:
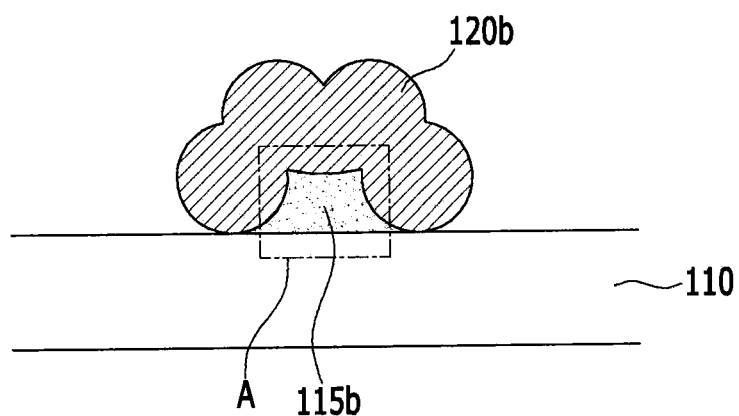
Figure 6A:
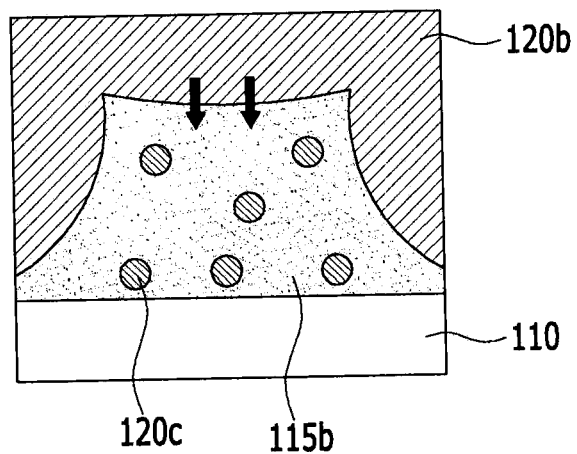
FIGS. 6A to 6C are schematic views enlarging a region 'A' in FIG. 5.
Figure 6B:
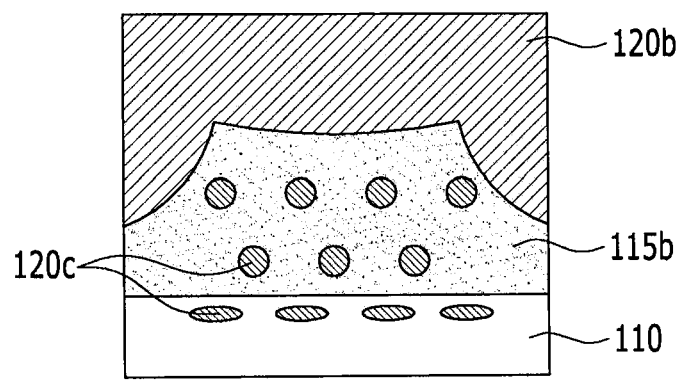
Figure 6C:
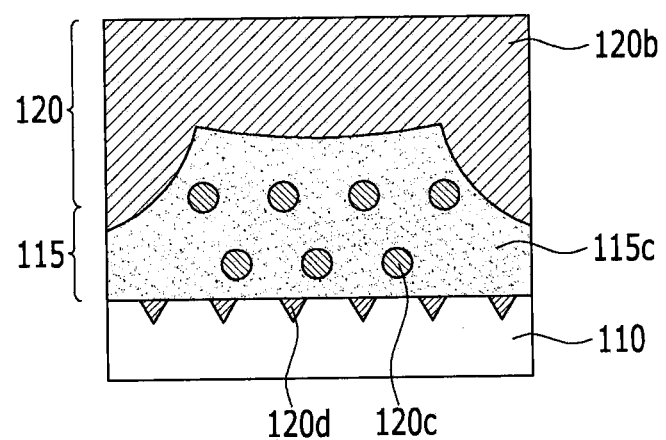

Referring to FIGS. 3 to 6C, the process of manufacturing an electrode using the conductive paste may be described. FIGS. 3 to 5 are schematic diagrams showing that a conductive powder and a metallic glass may be deformed by heat and contact a semiconductor substrate when a conductive paste according to example embodiments may be applied on the semiconductor substrate. FIGS. 6A to 6C are schematic diagrams enlarging a region "A" in FIG. 5.

Referring to FIG. 3, a conductive paste including a conductive powder 120a and a metallic glass 115a may be applied on a semiconductor substrate 110. The conductive powder 120a and the metallic glass 115a may respectively exist as particles.

Referring to FIG. 4, when the metallic glass 115a is heated beyond the glass transition temperature ($T_g$), the metallic glass 115a may become soft and may be turned into a liquid-like metallic glass 115b. The liquid-like metallic glass 115b may fill a gap among a plurality of conductive powder particles 120a. The metallic glass 115a may be softened relatively quickly because the glass transition temperature (Tg) of the metallic glass may be lower than the sintering temperature (Ts) of the conductive powder 120a.

Referring to FIG. 5, when the conductive paste is heated higher than the sintering temperature, the conductive powder particles 120a may be sintered and in close contact with neighboring conductive powder particles 120a, thereby forming a conductive powder mass 120b.

Referring to FIGS. 4 and 5, the liquid-like metallic glass 115b may be a supercooled liquid, and thus may wet the semiconductor substrate 110.

Referring to FIG. 6A, when the metallic glass 115b demonstrating a liquid-like behavior is a supercooled liquid, some conductive particles 120c of the conductive powder mass 120b may be diffused into the liquid-like metallic glass 115b, because the metallic glass 115b demonstrating a liquid-like behavior includes a component that is capable of forming a solid solution with the conductive powder 120b as described above.

In addition, when the supercooled liquid region of the metallic glass is expanded, the time period that the liquid-like metallic glass 115b having a low viscosity is in contact with the semiconductor substrate 110 may be prolonged to enhance the wettability of the metallic glass 115b against the semiconductor substrate 110. Thereby, the supercooled liquid region may increase the contact area between the metallic glass 115b and the semiconductor substrate 110.

Referring to FIG. 6B, when the metallic glass is heated higher than the above temperature, the conductive particles 120c diffused into the liquid-like metallic glass 115b may permeate into the semiconductor substrate 110. Herein, because the wettability of the liquid-like metallic glass 115b is enhanced, the liquid-like metallic glass 115b may more closely contact the semiconductor substrate 110, thereby enlarging an area where the conductive particles 120c permeate into the semiconductor substrate 110.

Referring to FIG. 6C, when the semiconductor substrate 110 is cooled, the conductive particles 120c may permeate into the semiconductor substrate 110 and recrystallize, thereby forming recrystallized conductive particles 120d at the surface of the semiconductor substrate 110. On the other hand, the liquid-like metallic glass 115b may be also recrystallized into a crystalline metallic glass 115c. The conductive particles 120c inside a metallic glass may also be recrystallized.

Accordingly, when the conductive powder 120b is formed into an electrode portion 120, a buffer layer 115 including the crystalline metallic glass 115c may be further disposed between the electrode portion 120 and the semiconductor substrate 110. Thereby, the electrode prepared using the conductive paste may include a buffer layer 115 on a first region adjacent to the semiconductor substrate 110, and an electrode portion 120 on a second region different from the first region, i.e., where the buffer layer 115 is formed. FIG. 6C shows that the buffer layer 115 may be formed, but may not be limited thereto. The buffer layer 115 may be omitted, or may be formed at a region adjacent to the semiconductor substrate 110.

The buffer layer 115 and the recrystallized conductive particles 120d on the surface of the semiconductor substrate 110 may decrease contact resistance between the semiconductor substrate 110 and the electrode portion 120 and thus reduce charge loss of solar energy as well as facilitate effective transfer of charges produced from the semiconductor substrate 110 by solar energy to the electrode portion 120. Accordingly, a solar cell may have improved efficiency. The electrode may be used as a conductive electrode in various electronic devices.

Figure 7:
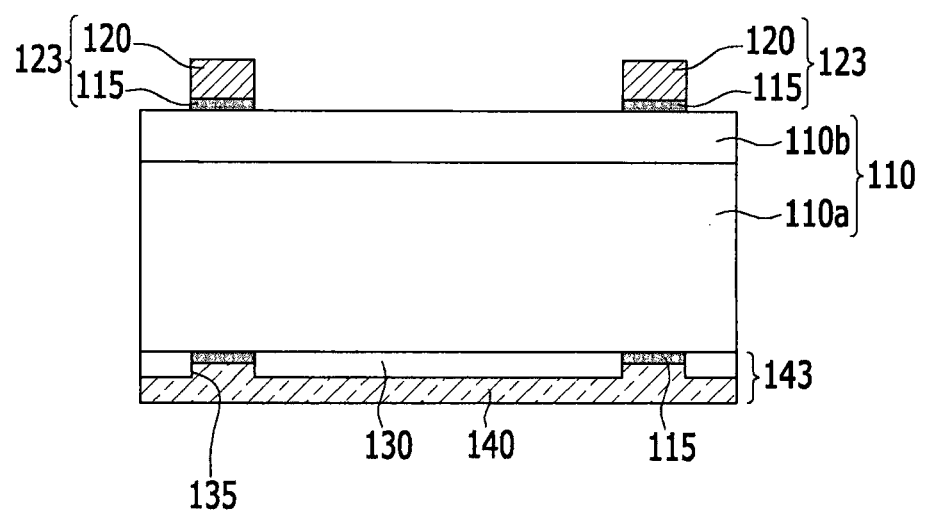

FIG. 7 is a cross-sectional view showing a solar cell according to example embodiments. Hereinafter, the spatial relationship of components will be described with respect to a semiconductor substrate 110 for better understanding and ease of description, but the present disclosure may be not limited thereto. In addition, a solar energy incident side of the semiconductor substrate 110 may be termed a front side and the opposite side may be called a rear side, although alternative configurations may be possible.

Referring to FIG. 7, a solar cell according to example embodiments may include a semiconductor substrate 110 including a lower semiconductor layer 110a and an upper semiconductor layer 110b.

The semiconductor substrate 110 may include crystalline silicon or a compound semiconductor. The crystalline silicon may be, for example, a silicon wafer. Either of the lower semiconductor layer 110a and the upper semiconductor layer 110b may be a semiconductor layer doped with a p-type impurity, while the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element, e.g., boron (B), and the n-type impurity may be a Group V element, e.g., phosphorus (P).

The surface of the upper semiconductor layer 110b may be textured by a surface texturing process. The surface-textured upper semiconductor layer 110b may have protrusions and depressions, and may include a pyramidal shape, or may have a porous structure having a honeycomb shape, for example. The surface-textured upper semiconductor layer 110b may have an enhanced surface area to improve the light-absorption rate and decrease reflectivity, thereby improving efficiency of a solar cell.

A plurality of front electrodes 123 may be disposed on the upper semiconductor layer 110b. The plurality of front electrodes 123 may be arranged in parallel to the direction of the substrate 110 and may have a grid pattern shape to reduce shadowing loss and sheet resistance.

Each of the plurality of front electrodes 123 may include a buffer layer 115 on a first region adjacent to the upper semiconductor layer 110b, and the front electrode portion 120 on a second region different than the first region. FIG. 7 shows that the buffer layer 115 may be formed on the upper semiconductor layer 110b, but may not be limited thereto. The buffer layer 115 may be omitted, or may be formed at a different region adjacent to the upper semiconductor layer 110b.

The plurality of front electrodes 123 may be formed by a screen printing method using a conductive paste. The conductive paste may be the same as described above. The front electrode portion 120 may be formed of a conductive material, for example, a low resistance conductive material, e.g., silver (Ag).

A buffer layer 115 may be disposed between the upper semiconductor layer 110b and the front electrode portion 120. The buffer layer 115 may be conductive due to inclusion of a metallic glass. Because the buffer layer 115 may have portions that contact the front electrode portion 120 and the upper semiconductor layer 110b, the buffer layer 115 may decrease loss of electric charges by improving a path for transferring the electric charges between the upper semiconductor layer 110b and the front electrode portion 120.

The metallic glass of the buffer layer 115 may be derived from the conductive paste used to form the front electrode portion 120. The metallic glass may melt before the conductive material of the front electrode portion 120 during processing, so that the metallic glass may be disposed under the front electrode portion 120.

A bus bar electrode (not shown) may be disposed on the front electrode portion 120. The bus bar electrode may connect adjacent solar cells of a plurality of solar cells.

A dielectric layer 130 may be disposed under the semiconductor substrate 110. The dielectric layer 130 may increase efficiency of a solar cell by substantially preventing or inhibiting recombination of electric charges and leakage of electric current. The dielectric layer 130 may include a through-hole 135. A rear electrode 143, which is further disclosed below, may contact the semiconductor substrate 110 through the through-hole 135. The dielectric layer 130 may include silicon oxide ($SiO_2$), silicon nitride ($SiN_x$), aluminum oxide ($Al_2O_3$), or a combination thereof, and may have a thickness of about 100 Å to about 2000 Å.

The rear electrode 143 may be disposed under the dielectric layer 130. The rear electrode 143 may include a conductive material, for example, an opaque metal, e.g., aluminum (Al). The rear electrode may be formed by a screen printing method using a conductive paste in the same manner as the plurality of front electrodes 123.

The rear electrode may include a buffer layer 115 on a first region adjacent to a lower semiconductor layer 110a, and a rear electrode portion 140 on a second region different from the first region and including a conductive material in the same manner as the plurality of front electrodes 123. FIG. 7 shows that the buffer layer 115 may be formed on the lower semiconductor layer 110a, but may not be limited thereto. The buffer layer 115 may be omitted, or may be formed at a different region adjacent to the lower semiconductor layer 110a.

Hereinafter, a method of manufacturing the solar cell may be further disclosed with reference to FIG. 7. A semiconductor substrate 110, which may be a silicon wafer, for example, may be prepared. The semiconductor substrate 110 may be doped with a p-type impurity, for example.

The semiconductor substrate 110 may be subjected to a surface texturing treatment. The surface-texturing treatment may be performed with a wet method using a strong acid, e.g., nitric acid or hydrofluoric acid, or a strong base, e.g., sodium hydroxide, or by a dry method, e.g., plasma treatment.

The semiconductor substrate 110 may be doped with an n-type impurity, for example. The n-type impurity may be doped by diffusing $POCl_3$, or $H_3PO_4$ at a relatively high temperature. The semiconductor substrate 110 includes a lower semiconductor layer 110a and an upper semiconductor layer 110b doped with different impurities from each other.

A conductive paste for a front electrode may be applied on the upper semiconductor layer 110b. The conductive paste for a front electrode may be provided by a screen printing method. The screen printing method includes applying the conductive paste, which includes a conductive powder, a metallic glass, and an organic vehicle, on a surface where a front electrode may be disposed and drying the same.

As further disclosed above, the conductive paste may include a metallic glass. The metallic glass may be prepared using any method, e.g., melt spinning, infiltration casting, gas atomization, ion irradiation, or mechanical alloying. The conductive paste for a front electrode may be dried.

A dielectric layer 130 may be provided by laminating aluminum oxide (e.g., $Al_2O_3$) or silicon oxide (e.g., $SiO_2$) on the rear side of the semiconductor substrate 110, for example, by a plasma enhanced chemical vapor deposition ("PECVD") method. A plurality of through-holes 135 may be provided on a portion of the dielectric layer 130 by using a laser, for example. The conductive paste for a rear electrode may be subsequently applied on a side of the dielectric layer 130 by a screen printing method. The conductive paste for a rear electrode may be dried.

The conductive pastes for the front and rear electrodes may be fired in sequence or simultaneously. The firing may be performed at a temperature that is higher than the melting temperature of the conductive metal in a furnace, for example, at a temperature ranging from about 200° C. to about 1000° C., for example, about 400° C. to about 1000° C.

Figure 8:
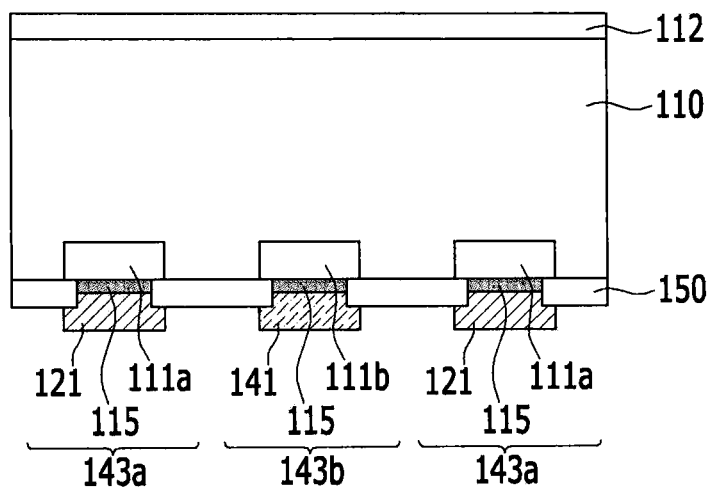

FIG. 8 is a cross-sectional view showing a solar cell according to example embodiments. A solar cell may include a semiconductor substrate 110 doped with a p-type or n-type impurity. The semiconductor substrate 110 may include a plurality of first doping regions 111a and second doping regions 111b that may be provided on the rear side of the semiconductor substrate 110 and may be doped with different impurities from each other. For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

The front side of the semiconductor substrate 110 may be surface-textured, and therefore may enhance the light-absorption rate and decrease the reflectivity, thereby improving efficiency of a solar cell An insulation layer 112 may be provided on the semiconductor substrate 110. The insulation layer 112 may include an insulating material that absorbs relatively little light, for example, silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), or a combination thereof. The insulation layer 112 may be a single layer or more than one layer. The insulation layer 112 may have a thickness ranging from about 200 Å to about 1500 Å.

The insulation layer 112 may be an anti-reflective coating ("ARC") that decreases the reflectivity of light and increases selectivity of a particular wavelength region on the surface of the solar cell, and simultaneously improves properties of silicon on the surface of the semiconductor substrate 110, thereby increasing efficiency of the solar cell.

A dielectric layer 150 including a plurality of through-holes may be disposed on the rear side of the semiconductor substrate 110. The first electrode 143a electrically connected with the first doping region 111a and the second electrode 143b electrically connected with the second doping region 111b may be disposed on the rear side of the semiconductor substrate 110, respectively. The first electrode 143a and the first doping region 111a may be contacted through a through-hole, and the second electrode 143b and the second doping region 111b may be in contact through a through-hole. The first electrode and the second electrode may be alternately disposed.

The first electrode 143a may include a buffer layer 115 on a first region adjacent to the first doping region 111a, and a first electrode portion 121 on a second region different from the first region. The second electrode 143b may include a buffer layer 115 on a first region adjacent to the second doping region 111b, and a second electrode portion 141 on a second region different from the first region. However, the first and second electrodes 143a and 143b may not be limited thereto. The buffer layer 115 may be omitted, or may be formed on a region adjacent to the first doping region 111a, a region adjacent to the second doping region 111b, or a combination thereof.

As disclosed in example embodiments, the first electrode 143a and the second electrode 143b may be disposed using a conductive paste including a conductive powder, a metallic glass, and an organic vehicle, which may be the same as described above.

A buffer layer 115 may be disposed between the first doping region 111a and the first electrode portion 121, or between the second doping region 111b and the second electrode portion 141. The buffer layer 115 may be electrically conductive due to inclusion of a metallic glass. Because the buffer layer 115 includes portions contacting either the first electrode portion 121 or the second electrode portion 141, and portions contacting either the first doping region 111a or the second doping region 111b, respectively, loss of electric charges may be decreased by improving the path for transferring electric charges between the first doping region 111a and the first electrode portion 121, or between the second doping region 111b and the second electrode portion 141.

A solar cell according to example embodiments including both the first electrode 143a and the second electrode 143b on the rear surface of the solar cell may decrease an area where a metal may be disposed on the front surface, thereby decreasing shadowing loss and increasing solar cell efficiency.

Hereinafter, the method of manufacturing a solar cell will be further disclosed referring to FIG. 8. A semiconductor substrate 110 doped with, for example, an n-type impurity may be prepared. The semiconductor substrate 110 may be surface-textured, and an insulation layer 112 and a dielectric layer 150 may be disposed on a front side and a rear side of the semiconductor substrate 110, respectively. The insulation layer 112 and the dielectric layer 150 may be provided by chemical vapor deposition ("CVD"), for example.

The first doping region 111a and the second doping region 111b may be disposed by sequentially doping a p-type impurity and an n-type impurity at a relatively high concentration on the rear side of the semiconductor substrate 110.

A conductive paste for a first electrode may be applied on a portion of the dielectric layer 150 corresponding to the first doping region 111a, and a conductive paste for a second electrode may be applied on a portion of the dielectric layer 150 corresponding to the second doping region 111b. The conductive paste for the first electrode and the conductive paste for the second electrode may be disposed by a screen printing method, for example, wherein the conductive paste may include a conductive powder, a metallic glass, and an organic vehicle.

The conductive paste for the first electrode and the conductive paste for the second electrode may be fired in sequence or simultaneously. The firing may be performed in a furnace at a temperature that may be higher than the melting temperature of a conductive metal in a furnace.

Herein, the conductive paste may be applied to provide an electrode for a solar cell, but may be used for an electrode for other electronic devices, e.g., a plasma display panel ("PDP"), a liquid crystal display ("LCD"), and an organic light emitting diode ("OLED").

The following examples illustrate this disclosure in further detail. However, it may be understood that this disclosure shall not be limited by these examples.

Fabrication of Metallic Glass

Example 1

Copper (Cu), zirconium (Zr), tin (Sn), and antimony (Sb) elements having purity of about 99% or more may be prepared and weighed to provide a composition of $Cu_{46}Zr_{46}Sn_4Sb_4$. The entire weight may be set to about 8 g.

The mixed metal mass may be melted by using an arc melter filled with argon gas to provide a Cu—Zr—Sn—Sb alloy. The alloy may be introduced into a quartz tube and mounted with a melt spinner, and the alloy may be melted by induction heating. The melted metal may be quenched by spraying toward a copper (Cu) wheel rotating at about 3000 rpm using argon gas to provide a metallic glass ribbon of $CU_{46}Zr_{46}Sn_4Sb_4$.

Example 2

A metallic glass may be fabricated in accordance with the same procedure as in Example 1, except that phosphorus (P)

may be used instead of antimony (Sb) to provide an alloy having a composition of $Cu_{46}Zr_{46}Sn_4P_4$.

Example 3

A metallic glass may be fabricated in accordance with the same procedure as in Example 1, except that beryllium (Be) may be used instead of antimony (Sb) to provide an alloy having a composition of $Cu_{46}Zr_{46}Sn_4Be_4$.

Example 4

A metallic glass may be fabricated in accordance with the same procedure as in Example 1, except that boron (B) may be used instead of antimony (Sb) to provide an alloy having a composition of $Cu_{46}Zr_{46}Sn_4B_4$.

Comparative Example 1

A metallic glass may be fabricated in accordance with the same procedure as in Example 1, except that antimony (Sb) may be not included to provide an alloy having a composition of $Cu_{48}Zr_{48}Sn_4$.

Comparative Example 2

A metallic glass may be fabricated in accordance with the same procedure as in Example 1, except that silicon (Si) may be used instead of antimony (Sb) to provide an alloy having a composition of $Cu_{47.5}Zr_{47.5}Sn_4Si$.

Silicon (Si) and copper (Cu) may have an atom radius difference of about 8.9% according to the previously-noted equation.

Assessment of Supercooled Liquid Region of Metallic Glass

The metallic glass obtained from Example 1 and Comparative Examples 1 and 2 may be measured for the supercooled liquid region using differential scanning calorimetry (DSC), and may be described with reference to FIG. 2A to FIG. 2C.

Figure 2A:
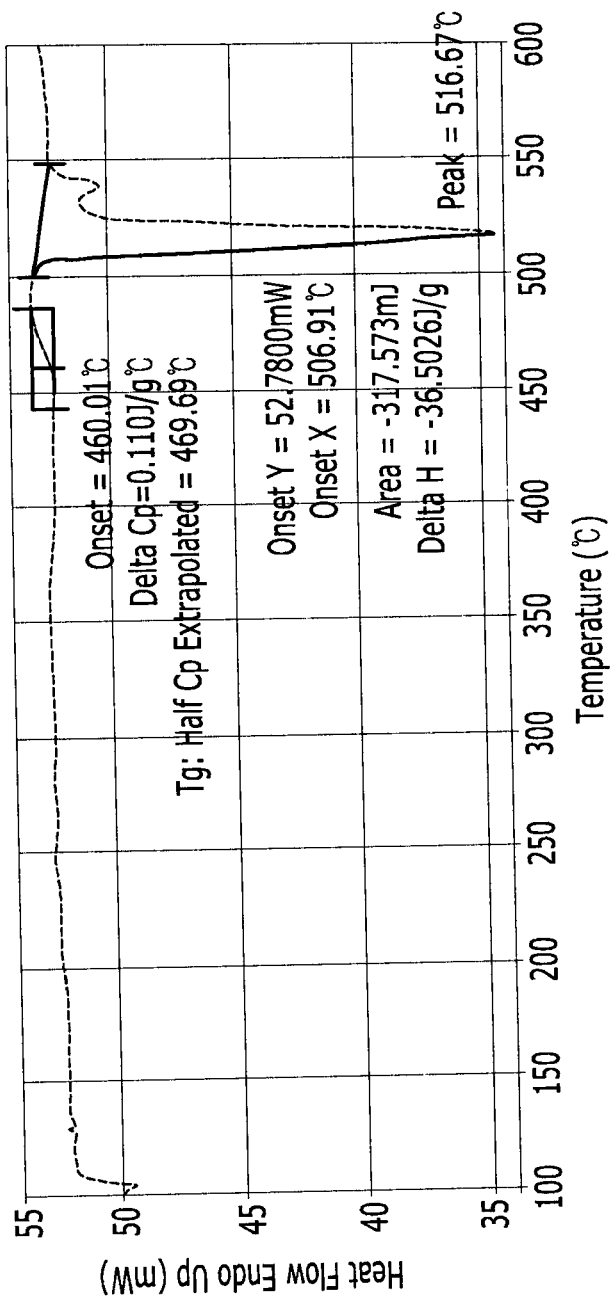
FIG. 2A is a graph showing a differential scanning calorimetry curve of metallic glass $Cu_{46}Zr_{46}Sn_4Sb_4$ according to Example 1.
Figure 2B:
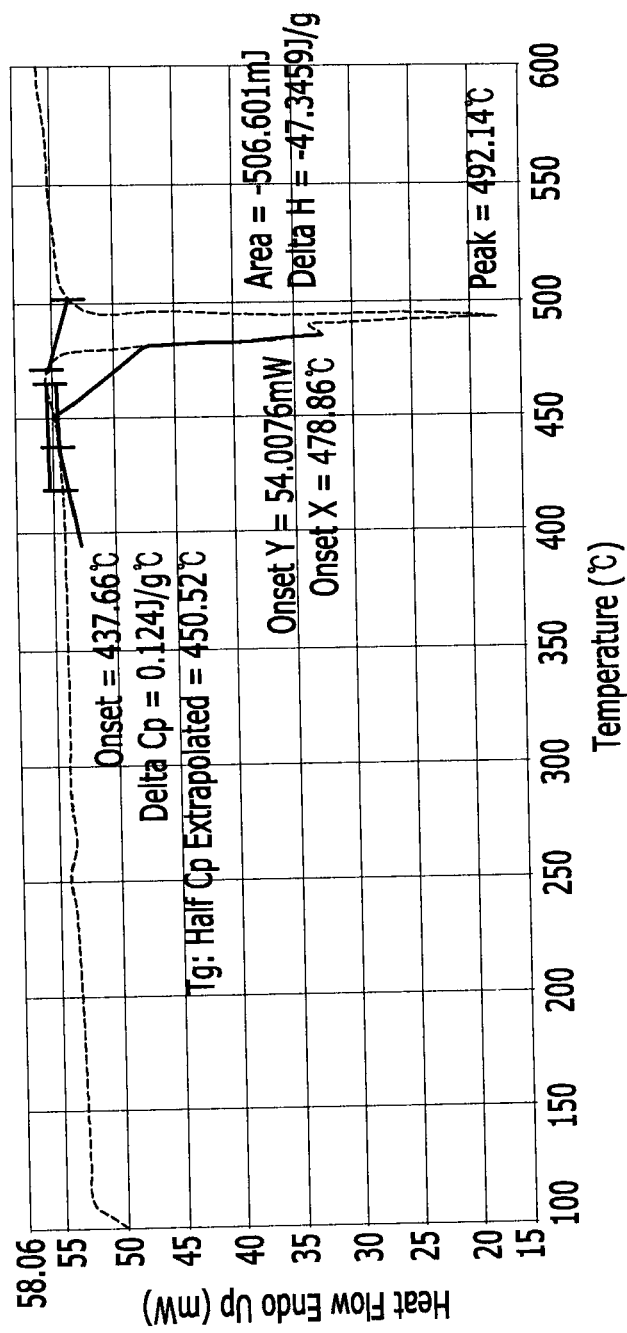
FIG. 2B is a graph showing a differential scanning calorimetry curve of metallic glass $Cu_{48}Zr_{48}Sn_4$ according to Comparative Example 1.
Figure 2C:
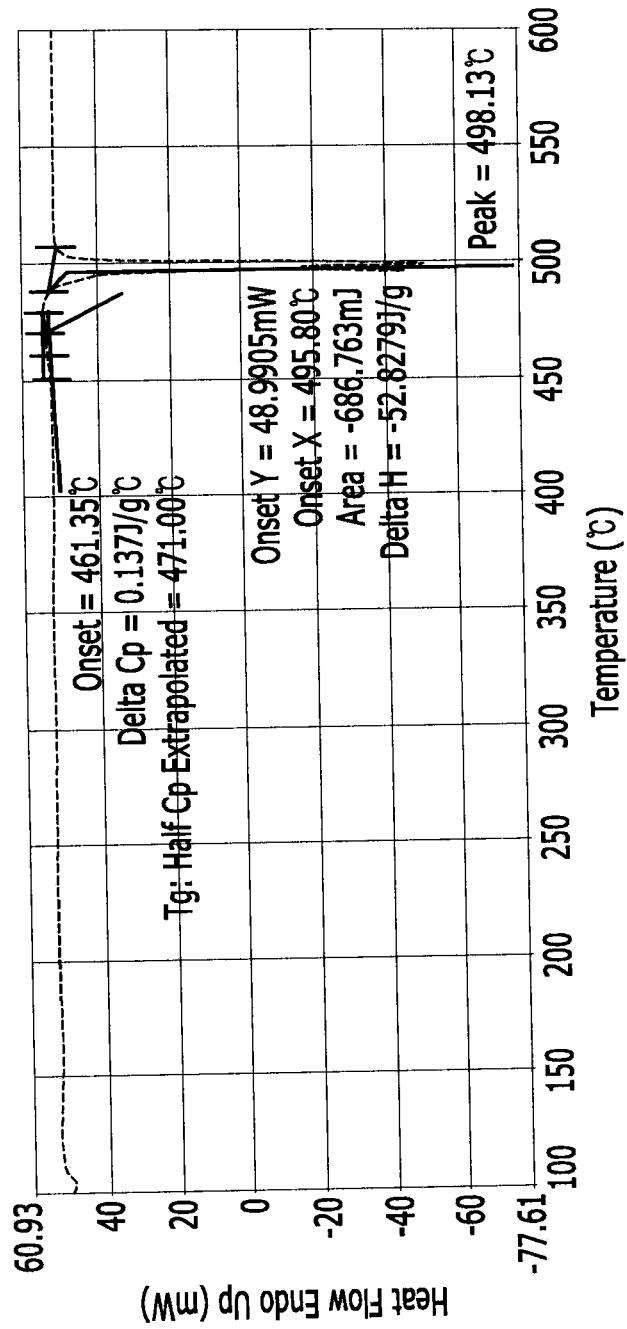
FIG. 2C is a graph showing a differential scanning calorimetry curve of metallic glass $Cu_{47.5}Zr_{47.5}Sn_4Si$ according to Comparative Example 2.

FIG. 2A is a graph showing a differential scanning calorimetry curve for metallic glass $Cu_{46}Zr_{46}Sn_4Sb_4$ according to Example 1, FIG. 2B is a graph showing a differential scanning calorimetry curve for metallic glass $Cu_{48}Zr_{48}Sn_4$ according to Comparative Example 1, and FIG. 2C is a graph showing a differential scanning calorimetry curve for metallic glass $Cu_{47.5}Zr_{47.5}Sn_4Si$ according to Comparative Example 2.

Referring to FIG. 2A, the metallic glass $Cu_{46}Zr_{46}Sn_4Sb_4$ according to Example 1 may have a glass transition temperature (Tg) and a crystallization temperature (Tc) of about 469.69° C. and about 506.91° C., respectively. From the results, the supercooled liquid region, which may be the temperature region between the glass transition temperature (Tg) and the crystallization temperature (Tc), may be about 37.22° C.

On the other hand, referring to FIG. 2B, the metallic glass $Cu_{48}Zr_{48}Sn_4$ according to Comparative Example 1 which does not include antimony (Sb) may have a glass transition temperature (Tg) and a crystallization temperature (Tc) of about 450.52° C. and about 478.86° C., respectively. From the results, the supercooled liquid region, which may be the temperature region between the glass transition temperature (Tg) and the crystallization temperature (Tc), may be about 28.34° C.

In addition, referring to FIG. 2C, the metallic glass $Cu_{47.5}Zr_{47.5}Sn_4Si$ according to Comparative Example 2 including silicon (Si) instead of antimony (Sb) may have a glass transition temperature (Tg) and a crystallization temperature (Tc) of about 471° C. and about 495.80° C., respectively. From the results, the supercooled liquid region which may be the temperature region between the glass transition temperature (Tg) and the crystallization temperature (Tc) may be about 24.80° C.

Thereby, the supercooled liquid region may be extended by about 8.88° C. by including a first element of antimony (Sb) compared to including no first metal, and the supercooled liquid region may be not expanded by including silicon (Si) instead of antimony (Sb).

Calculation of a Heat of Mixing Value

Each heat of mixing value of metallic glass according to Examples 1 to 4 and Comparative Example 1 may be calculated according to the following method. Herein, X may be antimony (Sb), phosphorus (P), beryllium (Be), and boron (B) according to Examples 1 to 4, respectively, as the first element.

i) $\Delta H_{Cu46Zr46Sn4X4} = (0.46 \times 0.46 \times \Delta H_{Cu-Zr}) + (0.46 \times 0.04 \times \Delta H_{Cu-Sn}) + (0.46 \times 0.04 \times \Delta H_{Cu-X}) + (0.46 \times 0.04 \times \Delta H_{Zr-Sn}) + (0.46 \times 0.04 \times \Delta H_{Zr-X}) + (0.04 \times 0.04 \times \Delta H_{Sn-X})$ ii) $\Delta H_{Cu48Zr48Sn4} = (0.48 \times 0.48 \times \Delta H_{Cu-Zr}) + (0.48 \times 0.04 \times \Delta H_{Cu-Sn}) + (0.48 \times 0.04 \times \Delta H_{Zr-Sn})$ The results are shown in Table 2.

TABLE 2

|  | Heat of mixing (kJ/mol) |
| --- | --- |
| Example 1 | −6.5060 |
| Example 2 | −7.8828 |
| Example 3 | −6.2964 |
| Example 4 | −6.2308 |
| Comparative Example 1 | −5.9900 |

Referring to Table 2, each metallic glass according to Examples 1 to 4 decreases the heat of mixing value compared to the metallic glass according to Comparative Example 1 including no first element.

While example embodiments have been described, it may be understood that example embodiments may not be limited to the disclosed embodiments, but, on the contrary, may be intended to cover various modifications and equivalent arrangements included within the spirit and scope of the appended claims.

What is claimed is:

1. A conductive paste, comprising:
a conductive powder, a metallic glass, and an organic vehicle,
wherein the metallic glass is an alloy having a disordered atomic structure that includes at least two elements and satisfying the following equation:

$$\frac{|r_1 - r_n|}{\left(\frac{r_1 + r_n}{2}\right)} \times 100 \geq 9\% \quad \text{[Equation]}$$

wherein, in the equation, $r_1$ is an atom radius of a first element among the at least two elements included in the metallic glass, $r_n$ is an atom radius of other elements among the at least two elements included in the metallic glass, and n is an integer ranging from 2 to 10.

2. The conductive paste of claim 1, wherein the metallic glass includes a supercooled liquid region.

3. The conductive paste of claim 2, wherein a temperature of the supercooled liquid region ranges from about 5° C. to about 200° C.

4. The conductive paste of claim 1, wherein the metallic glass has a heat of mixing value of less than 0 kJ/mole.

5. The conductive paste of claim 1, wherein the at least two elements in the metallic glass include at least one of:
- a second element having a resistivity less than about 100 µΩcm;
- a third element configured to form a solid solution with the conductive powder; and
- a fourth element having an absolute value of Gibbs free energy of oxide formation that is about 100 kJ/mol or more.

6. The conductive paste of claim 5, wherein the resistivity of the second element is less than about 15 µΩcm.

7. The conductive paste of claim 5, wherein the third element has a heat of mixing value of less than 0 kJ/mole with the conductive powder.

8. The conductive paste of claim 5, wherein the fourth element has a higher absolute value of Gibbs free energy of oxide formation than the first element, the second element, and the third element.

9. The conductive paste of claim 5, wherein
- the second element, the third element, and the fourth element are respectively selected from copper (Cu), zirconium (Zr), and tin (Sn), and
- the first element is selected from phosphorus (P), antimony (Sb), beryllium (Be), boron (B), thorium (Th), erbium (Er), terbium (Tb), promethium (Pm), dysprosium (Dy), yttrium (Y), samarium (Sm), gadolinium (Gd), holmium (Ho), neodymium (Nd), cerium (Ce), lanthanum (La), calcium (Ca), ytterbium (Yb), europium (Eu), strontium (Sr), barium (Ba), potassium (K), rubidium (Rb), cesium (Cs), and a combination thereof.

10. The conductive paste of claim 1, wherein the conductive powder, the metallic glass and the organic vehicle are included at about 30 wt % to about 99 wt %, about 0.1 wt % to about 20 wt %, and about 0.9 wt % to about 69.9 wt % based on the total amount of the conductive paste, respectively.

11. An electronic device comprising an electrode formed using the conductive paste according to claim 1.

12. A solar cell, comprising:
an electrode electrically connected with a semiconductor layer, the electrode formed using the conductive paste according to claim 1.

13. The solar cell of claim 12, wherein the metallic glass has a heat of mixing value of less than 0 kJ/mole.

14. The solar cell of claim 12, wherein the at least two elements in the metallic glass include at least one of:
- a second element having a resistivity less than about 100 µΩcm;
- a third element configured to form a solid solution with the conductive powder; and
- a fourth element having an absolute value of Gibbs free energy of oxide formation that is about 100 kJ/mol or more.

15. The solar cell of claim 14, wherein the resistivity of the second element is less than about 15 µΩcm.

16. The solar cell of claim 14, wherein the third element has a heat of mixing value of less than 0 kJ/mole with the conductive powder.

17. The solar cell of claim 14, wherein the fourth element has a higher absolute value of Gibbs free energy of oxide formation than those of the first element, the second element, and the third element.

18. The solar cell of claim 12, wherein the electrode comprises:
- a buffer layer on a first region of the semiconductor layer; and
- an electrode portion on a second region of the semiconductor layer different from the first region.

19. The solar cell of claim 18, wherein the buffer layer includes a crystallized metallic glass.

20. The solar cell of claim 18, wherein at least one of the semiconductor layer, the buffer layer, and the interface of the semiconductor layer and the buffer layer includes a crystallized conductive powder.

* * * * *